United States Patent
Franz et al.

(10) Patent No.: US 11,417,451 B2
(45) Date of Patent: Aug. 16, 2022

(54) MAGNETIC BLOCKS FOR THERMALLY COUPLING COOLING COMPONENT AND HEAT SPREADER

(71) Applicant: Hewlett Packard Enterprise Development LP, Houston, TX (US)

(72) Inventors: John Franz, Houston, TX (US); Harvey J. Lunsman, Chippewa Falls, WI (US); Everett Salinas, Pasadena, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 17/073,022

(22) Filed: Oct. 16, 2020

(65) Prior Publication Data

US 2022/0122751 A1    Apr. 21, 2022

(51) Int. Cl.
| | |
|---|---|
| *H01F 7/02* | (2006.01) |
| *H05K 7/20* | (2006.01) |
| *H05K 7/14* | (2006.01) |

(52) U.S. Cl.
CPC ............. *H01F 7/0252* (2013.01); *H05K 7/14* (2013.01); *H05K 7/20445* (2013.01); *H05K 7/20509* (2013.01)

(58) Field of Classification Search
CPC .................................................... Y10T 24/32
See application file for complete search history.

(56) References Cited

U.S. PATENT DOCUMENTS

| | | | |
|---|---|---|---|
| 6,665,184 B2 | 12/2003 | Akselband | |
| 8,944,148 B2* | 2/2015 | Hawwa | F28F 3/02 165/80.1 |

(Continued)

FOREIGN PATENT DOCUMENTS

| | | |
|---|---|---|
| CN | 206619097 U | 11/2017 |
| CN | 108811474 A | 11/2018 |

OTHER PUBLICATIONS

EDSFF Group, "Delivering the Building Blocks for the Next Decade of Enterprise & Datacenter Storage Form Factors", available online at <https://web.archive.org/web/20200928020748/https://edsffspec.org/introduction-to-edsff/>, Sep. 28, 2020, 7 pages.

(Continued)

*Primary Examiner* — Mukundbhai G Patel
(74) *Attorney, Agent, or Firm* — Hewlett Packard Enterprise Patent Department

(57) ABSTRACT

Example implementations relate to an electronic system providing a thermal management of a removable device when connected to a host device of the electronic system. The host device includes a cooling component having a first surface, and a plurality of first blocks of magnetic materials coupled to the cooling component. The removable device includes a heat spreader having a second surface, a plurality of second blocks of magnetic materials coupled to the heat spreader, and a TIM disposed on the second surface. The removable device is detachably connectable to the host device. When the removable device is connected to the host device, and magnetic forces applied by at least one of the first blocks or second blocks to couple respective blocks to each other, the first blocks is aligned with the second blocks such that the first surface is in thermal communication with the second surface through the TIM.

18 Claims, 7 Drawing Sheets

(56) References Cited

U.S. PATENT DOCUMENTS

| | | |
|---|---|---|
| 9,217,560 B2 | 12/2015 | Harbers et al. |
| 9,534,852 B2* | 1/2017 | Gierl ........................ F28D 15/00 |
| 10,462,274 B2 | 10/2019 | Weng et al. |
| 2019/0115281 A1 | 4/2019 | Lee et al. |
| 2019/0141854 A1* | 5/2019 | Ku ..................... H05K 7/20154 |
| 2019/0385774 A1* | 12/2019 | Denham ................... H01F 7/20 |

OTHER PUBLICATIONS

Fiber Transceiver Solution, "Blog of Fiber Transceivers," Mar. 23, 2015, 3 pages.
Polymagnets Magnetics, "Polymagnets are the World's First Smart Magnets", available online at <https://web.archive.org/web/20201013124631/http://www.polymagnet.com/>, Oct. 13, 2020, 7 pages.

* cited by examiner

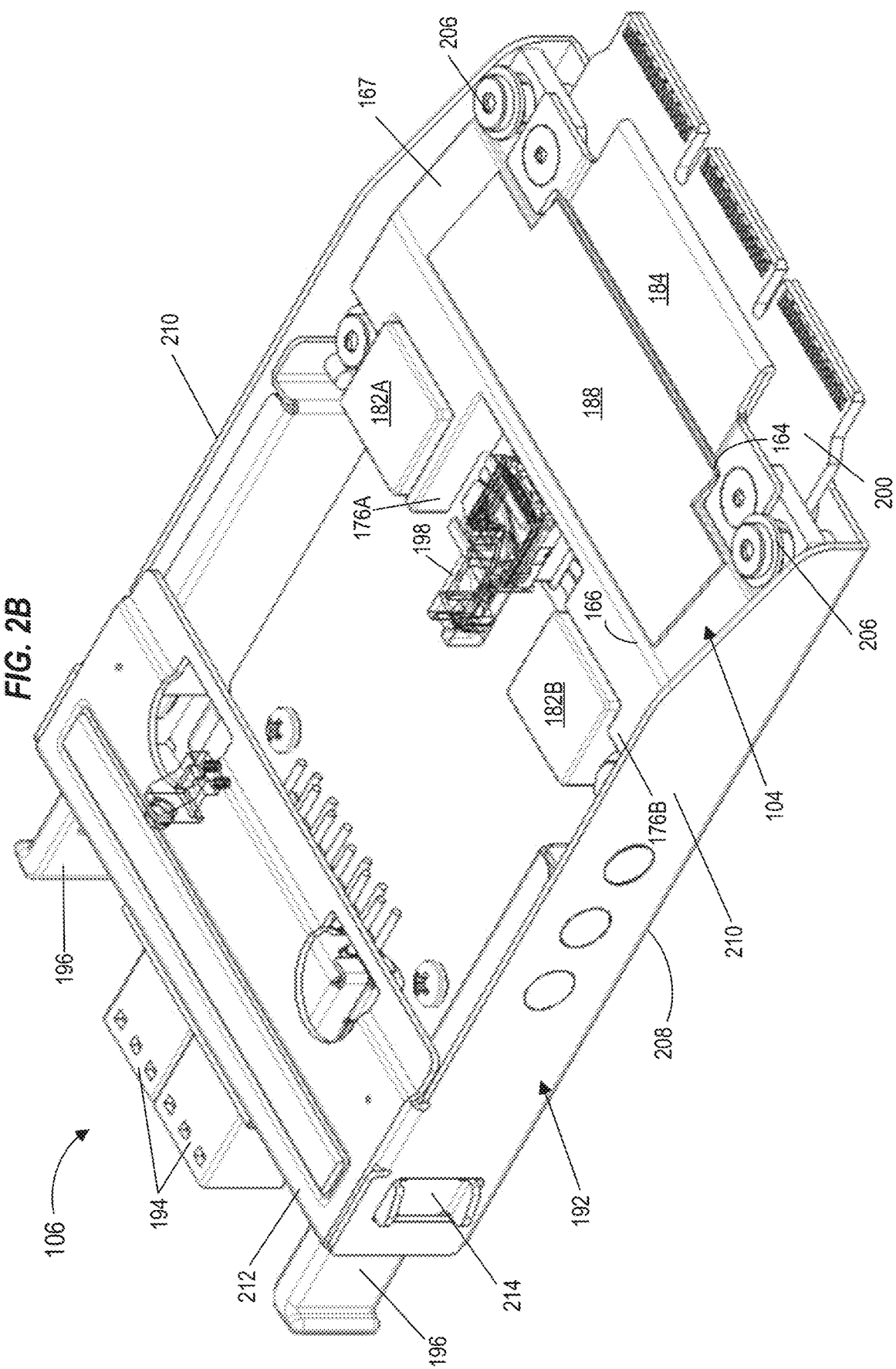

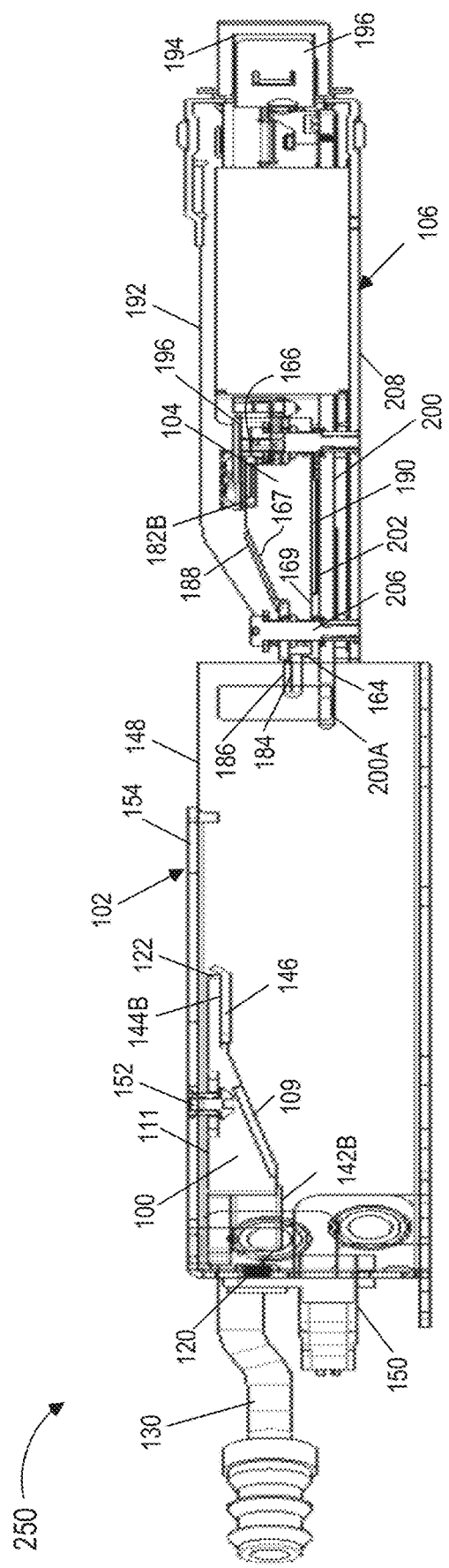

MAGNETIC BLOCKS FOR THERMALLY COUPLING COOLING COMPONENT AND HEAT SPREADER

BACKGROUND

A removable device, such as a small form-factor pluggable (SFP) transceiver device or a non-volatile memory express (NVMe) storage drive may consume a greater amount of power, while performing its respective functions, such as transmitting data, receiving data, processing data, storing data, or the like. Thus, the removable device may generate excessive waste-heat, while performing its respective functions. If adequate amount of the waste-heat is not dissipated from the removable device, it may exceed thermal specifications of the removable device, and thereby degrade the performance, reliability, life expectancy of the removable device, and may also cause its failure. Accordingly, one or more heat sinks may be used to regulate the waste-heat in the removable device.

BRIEF DESCRIPTION OF THE DRAWINGS

Various examples will be described below with reference to the following figures.

FIG. 2B illustrates a perspective view of a removable device having the heat spreader of FIG. 2A according to an example implementation of the present disclosure.

FIG. 3A illustrates a sectional side view of an electronic system having a removable device disconnected from a host device of the electronic system according to an example implementation of the present disclosure.

DETAILED DESCRIPTION

Figure 1A:
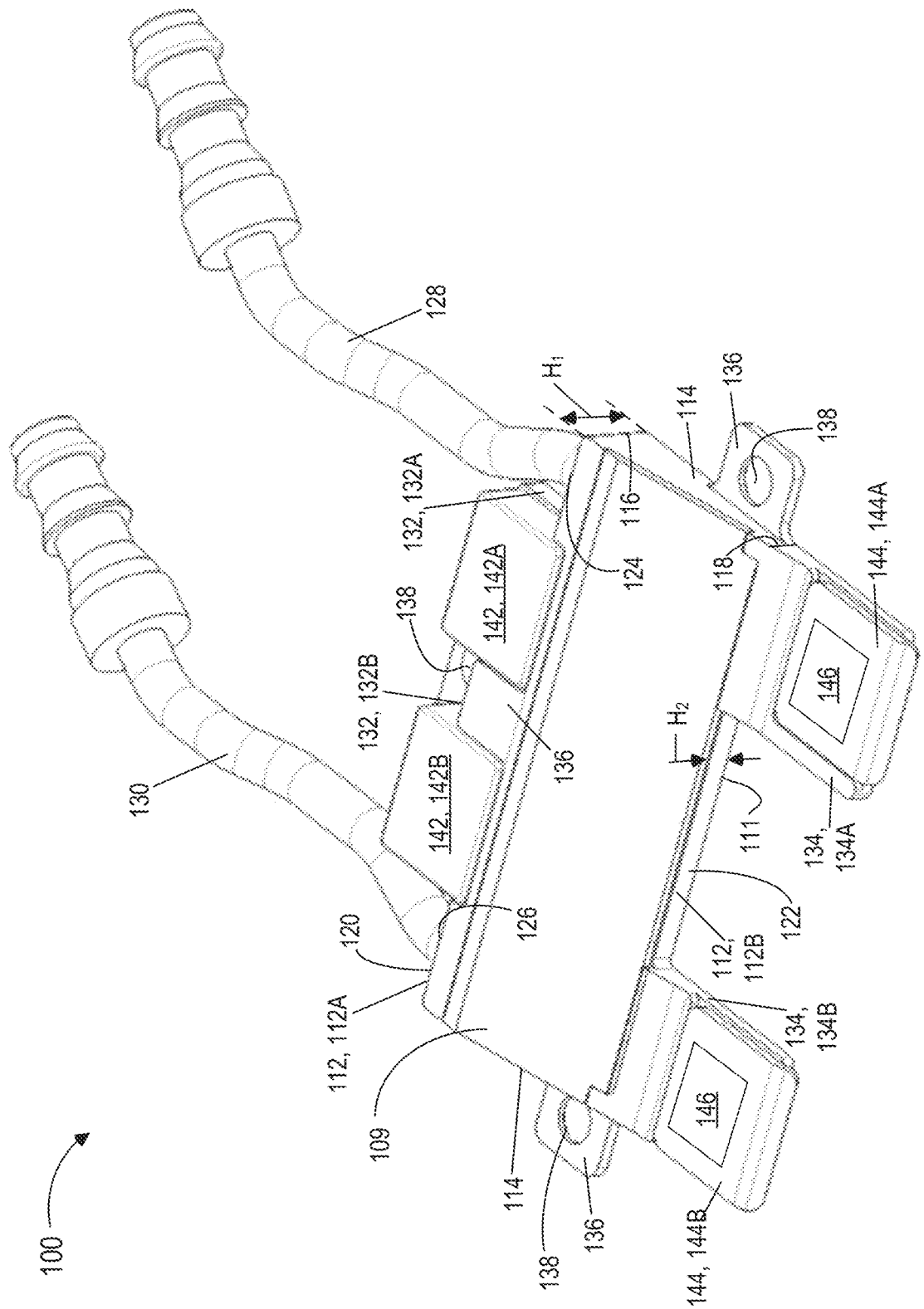
FIG. 1A illustrates a perspective view of a cooling component according to an example implementation of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

As used herein, the term "host device" may refer to a type of a computing device, such as a server device, a storage device, a power conversion device, or a networking device, having a connector or a modular port for receiving a removable device. As used herein, the term "removable device" may refer to a type of a connectable electronic device, which is not native to the host device, or which is ancillary to the host device, and may have to be connected by way of plugging into the modular port of the host device for transmitting, receiving, storing, or processing data. For example, the removable device may be a pluggable transceiver device or a pluggable storage drive, or the like. The term "modular port" may refer to a type of electronic connector, which is native to the host device, or which is integral to the host device, and may provision the removable device to be detachably connectable to the host device. As used herein, the term "electronic system" may refer to a type of a compute infrastructure, for example, a rack or an enclosure, where the removable device and the host device may function as a plug and a socket of the compute infrastructure. Further, the term "connectable" may refer to fitting or plugging of the removable device into the modular port of the host device by way of inserting or sliding of the removable device into the modular port/socket of the host device. Further, as used herein, the term "thermal interface" may refer to surfaces of two components, which are in direct contact or indirect contact with one another to establish the thermal communication there between, so as to allow a waste-heat to transfer between those two components. As used herein the term "cold plate" may refer to a type of a thermally conductive component, which may contain an internal tubing through which a liquid coolant is forced to flow, so as to absorb the waste-heat transferred to the cooling component by a waste-heat producing component, for example, a circuit board of a removable device, or one or more electronic components mounted on the circuit board. In some examples, the cold plate may also be referred to as a liquid-cooled dissipater. Further, the term "heat sink" may refer to a type of a passive heat exchanger that may transfer the waste-heat generated by the waste-heat producing component to a fluid medium, such as an air or a liquid coolant flowing over the heat sink. It may be noted herein: an object, device, or assembly (which may comprise multiple distinct bodies that are thermally coupled, and may include multiple different materials), is in "thermal communication" or is "thermally conductive" between two thermal interfaces if any one of the following is true: (i) a heat transfer coefficient between the thermal interfaces is between 40 $\mathrm{W\cdot m^{-2}\cdot K^{-1}}$ and 100 $\mathrm{W\cdot m^{-2}\cdot K^{-1}}$ or at any temperature between 0° C. and 100° C., (ii) the object is continuous piece of a material that has a thermal conductivity (often denoted k, λ, or κ) between the two interfaces of about 40 $\mathrm{W\cdot m^{-2}\cdot K^{-1}}$ and 100 $\mathrm{W\cdot m^{-2}\cdot K^{-1}}$ or at any temperature between 0° C. and 100° C., or (iii) the object is a heat pipe, vapor chamber, continuous body of copper, or continuous body of aluminum. Examples of materials whose thermal conductivity is between 40 $\mathrm{W\cdot m^{-2}\cdot K^{-1}}$ and 100 $\mathrm{W\cdot m^{-2}\cdot K^{-1}}$ or between 0° C. and 100° C. include certain types of copper, aluminum, silver, and gold, for example.

The present disclosure describes example implementations of an electronic system providing a thermal management of a removable device when connected to a host device of the electronic system. In accordance to one or more examples of the present disclosure, the host device may include a cooling component having a first surface, and a plurality of first blocks of magnetic materials coupled to the cooling component. Similarly, the removable device may include a heat spreader having a second surface and a third surface, a plurality of second blocks of magnetic materials coupled to the heat spreader, a first thermal interface material (TIM) disposed on the second surface, and a second TIM disposed on the third surface. In such examples, the heat spreader is disposed on a circuit board of the removable device and/or one or more electronic components mounted on the circuit board such that the third surface of the heat spreader is in thermal communication with the circuit board and/or the one or more electronic components via the second TIM. In one or more examples, the removable device may be detachably connectable to the host device. In such examples, when the removable device is connected to the host device, magnetic forces applied by at least one of the plurality of first blocks or the plurality of second blocks to couple respective blocks to each other, the plurality of first blocks is aligned with the plurality of second blocks such that the first surface is in thermal communication with the second surface via the first TIM.

During operation of the electronic system, the one or more electronic components and/or the circuit board of the removable device may generate a considerable amount of waste-heat that needs to be removed in order to improve the performance, reliability, or life expectancy of the removable device. In such examples, the heat spreader may dissipate the waste-heat from the one or more electronic components and/or the circuit board via the second TIM and the third surface. Further, the cooling component may dissipate the waste-heat from the heat spreader via the second surface, the first TIM, and the first surface. In some examples, a cooling liquid circulated in the cooling component may dissipate the waste-heat from the cooling component. In such examples, the cooling component is a cold plate. In some other examples, air or liquid flowing over the cooling component may dissipate the waste-heat from the cooling component. In such examples, the cooling component is a heat sink.

For purposes of explanation, certain examples are described with reference to the components illustrated in FIGS. 1-4. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Further, the sequence of operations described in connection with FIGS. 3A and 3B are an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

A removable device, for example, a communication device or a storage drive may be a compact and a hot-pluggable electronic device/drive used for transferring, receiving, processing, or storing data. In some examples, the communication device, for example, a small form-factor pluggable (SFP) transceiver when connected to a host device, such as a networking device may function as an intermediary component between a networking device connector, such as a switch, a router, a firewall, or a network card (or MC) of the network device, and an interconnecting cable, such as a copper cable or an optical fiber that is coupled to the transceiver. Typically, in such examples, the transceiver converts electrical signals into optical signals or vice versa for transmitting or receiving data through the interconnecting cable. Accordingly, the transceiver may consume a greater amount of power to convert the signals, and may thereby produce excessive waste-heat. In some other examples, the storage device, for example, a non-volatile memory express (NVMe) storage drive when connected to the host device, such as the storage device may function as the intermediary component between a peripheral-component interconnect express (PCIe) connector of the storage device and a cable connecting the NVMe storage drive. Typically, in such examples, the NVMe storage drive may process, store, and transfer data through the cable. Accordingly, the NVMe storage drive may consume a greater amount of power to process, store, and transfer the data, and may thereby produce excessive waste-heat.

In such examples, if the excessive waste-heat produced by the removable device is not adequately dissipated, it may degrade the removable device's performance, reliability, life expectancy and may also cause its failure. Accordingly, a heat spreader is disposed in thermal communication with the removable device so as to dissipate the waste-heat from the removable device. In such examples, a cooling air passing over the heat spreader is used to remove the waste-heat from the heat sink. However, when the removable device is connected to the host device, the heat spreader may not receive adequate supply of the cooling air to remove the waste-heat from the heat spreader. Accordingly, the host device may provide a cooling component to remove the waste-heat from the heat spreader. Therefore, in such examples, when the removable device is connected to the host device, the cooling component of the host device and the heat spreader of the removable device, may have to establish and maintain the thermal communication there between to enable the transfer of the waste-heat from the heat spreader to the cooling component in order to remove the waste-heat from the heat spreader. However, establishing and maintaining thermal communication between the cooling component and the heat spreader (i.e., between interfacing components) may be difficult, as the interfacing components may have surface imperfections or may not have smooth surfaces. Therefore, in order to address the aforementioned issues, a thermal interface material (TIM), such as thermally conductive gap pads or thermal greases may be disposed in-between the interfacing components. However, in such examples, when the TIM is disposed between the interfacing components, the electronic system may need to apply a force (i.e., load) to establish and maintain the thermal communication between the interfacing components via the TIM. In other words, the load may have to be optimal (i.e., limited or restricted) on the interfacing components in order to establish and maintain the thermal communication between the interfacing components via the TIM. However, if the load gets transferred from the interfacing components to any other components of the removable device, it may damage those components. For example, as most of the removable device discussed hereinabove may have an open device structure i.e., a circuit board and/or one or more electronic components mounted on the circuit card may be directly exposed to outside environment, and may get damaged due to the load transferred from the interfacing components. In other words, since the one or more electronic components, such as a processing resource mounted on the circuit board, and/or a ball grid array (BGA) used for mounting the processing resource to the circuit board, are pressure sensitive components, they may crumble due to the load transferred from the interfacing components.

Further, during connecting and disconnecting the removable device to the host device, the cooling component of the host device may exert a resistive force opposing an insertion force applied to connect the removable device to the host device or a withdrawal force applied to disconnect the removable device from the host device. In such examples, maintaining an optimal resistive force, which is within acceptable safety limits to avoid repetitive force (e.g., insertion force or withdrawal force) related injuries are extremely difficult.

A technical solution to the aforementioned problems may include providing an electronic system for a thermal management of a removable device when connected to a host device of the electronic system. In one or more examples, the host device includes a cooling component and a plurality of first blocks of magnetic materials coupled to the cooling component. The removable device includes a heat spreader having a second surface and a third surface, a plurality of second blocks of magnetic materials coupled to the heat spreader, a first thermal interface material (TIM) disposed on the second surface, and a second TIM disposed on the third surface. In such examples, when the removable device is connected to the host device, magnetic forces applied by at least one of the plurality of first blocks or the plurality of second blocks to couple respective blocks to each other may allow the plurality of first blocks to align with the plurality of second blocks such that the first surface is in thermal communication with the second surface through the first TIM, In one or more examples, an amount of the magnetic forces applied by at least one of the first blocks or the second blocks are controllable in order to establish and maintain the thermal communication between the cooling component and the heat spreader (i.e., the interfacing components). Therefore, the magnetic forces applied by the magnetic blocks may not allow the transfer of load of the interfacing components to any other components of the removable device, for example at least one of the circuit board, the one or more electronic components mounted on the circuit board, or the BGA used for mounting the one or more electronic components on the circuit board.

In some examples, each of the plurality of first blocks of magnetic materials and the plurality of second blocks of magnetic materials may include at least one of a plurality of ferromagnetic blocks or a plurality of magnetic blocks. In one or more examples, at least one magnetic block of the plurality of magnetic blocks may be a permanent magnetic block or a temporary magnetic block. In some non-limiting examples, each of the plurality of first blocks of magnetic materials and the plurality of second blocks of magnetic materials may include a magnetic block. In other words, the host device and the removable device may have the plurality of magnetic blocks (and not the ferromagnetic blocks). In such examples, at least one magnetic block of the plurality of magnetic blocks may be a permanent magnetic block or a temporary magnetic block.

In one or more examples, the removable device may further include a layer of insulation material disposed on a surface (e.g., top surface) of the plurality of ferromagnetic blocks. In such examples, each of the plurality of ferromagnetic blocks may interface with a corresponding magnetic block of the plurality of magnetic blocks to form the gap there between. In such examples, the layer of insulation material may enable the interfacing components to slip (i.e., with substantially less friction there between the magnetic blocks and ferromagnetic blocks) during connecting or disconnecting of the removable and host devices. In one or more examples, the cooling component is movably coupled to a housing of the host device via a plurality of stand-offs. In such examples, when the magnetic forces applied by at least one of the plurality of first blocks or the plurality of second blocks to couple respective blocks to each other, the cooling component may move relative to the plurality of stand-offs and compress the first TIM in order to establish and maintain the thermal communication between the first and second surfaces via the first TIM.

In some examples, an amount of the magnetic forces applied by the first magnetic blocks and the second magnetic blocks are controllable based on at least one of size, and/or shape, and/or grade of the magnetic block, or an arrangement of magnetic poles of the magnetic block. In one or more examples, the amount of magnetic forces applied by at least one of the first blocks or the second blocks for coupling to each other may be regulated such that the load of the interfacing components are not transferred to other components of the removable device. In some examples, the magnetic forces applied by the first blocks and the second blocks of magnetic materials are equal and opposite between the cooling component and the heat spreader such that they form a closed system in which the magnetic forces cancel out, and result in zero net magnetic forces exerted on the circuit board, the one or more electronic components, or the BGA. In other words, the magnetic blocks of the cooling component may apply magnetic forces to pull up the magnetic blocks of the heat spreader, which may be exactly equal to the magnetic forces applied by the magnetic blocks of the heat spreader to pull down the magnetic blocks of the cooling component, thereby resulting in zero net magnetic forces exerted on the circuit board, the one or more electronic components, or the BGA. Hence, preventing the transfer of the load from the interfacing components to the circuit board, the one or more electronic components, or the BGA, and damage to those components.

In some examples, each of the plurality of the plurality of magnetic blocks is a conventional magnet. In some other examples, each of the plurality of magnetic blocks is a non-conventional magnet. In such examples, the non-conventional magnet may have magnetic poles (i.e., North Pole and South Pole) arranged adjacent to one another to control the amount of the magnetic forces generated by such non-conventional magnet. Similarly, the non-conventional magnet may have a rectangular shape, size of the non-conventional magnet may be about 10 mm to 20 mm, and the non-conventional magnet may have a N52 grade to generate the appropriate (controlled) magnetic forces to compress TIM via the interfacing components without transferring the load of the interfacing components to at least one of the circuit board, the one or more electronic components, or the BGA.

In some examples, the first surface of the cooling component is a first tapered surface extending between a first end and a second end of the cooling component. The second surface of the heat spreader is a second tapered surface extending between a first end and a second end of the heat spreader. In one or more examples, the first and second tapered surfaces are complementary surfaces to one another. Further, the magnetic blocks are disposed at a rear end of the cooling component and the heat spreader. Thus, during connecting the removable device to the host device, the magnetic blocks of the interfacing components may not interfere until the removable device is fully inserted into the host device. Also, the first tapered surface of the cooling component may not interfere with the second tapered surface of the removable device until the removable device is fully inserted into the host device. Thus, the aforementioned features of the removable and host devices may allow the host device to maintain an optimal resistive force against an insertion force or withdrawal force by the removable device, which is within acceptable safety limits to avoid repetitive force (e.g., insertion force or withdrawal force) related injuries.

Accordingly, in one or more examples of the present disclosure the electronic system having a host device provides an effective thermal management of a removable device when connected to the host device. In such examples, the host device includes a cooling component having a first surface, and a plurality of first blocks of magnetic materials coupled to the cooling component. The removable device includes a heat spreader having a second surface, a plurality of second blocks of magnetic materials coupled to the heat spreader, and a thermal interface material (TIM) disposed on the second surface. The removable device is detachably connectable to the host device. When the removable device is connected to the host device, and magnetic forces applied by at least one of the first blocks or second blocks to couple respective blocks to each other, the first blocks is aligned with the second blocks such that the first surface is in thermal communication with the second surface through the TIM.

Figure 1B:
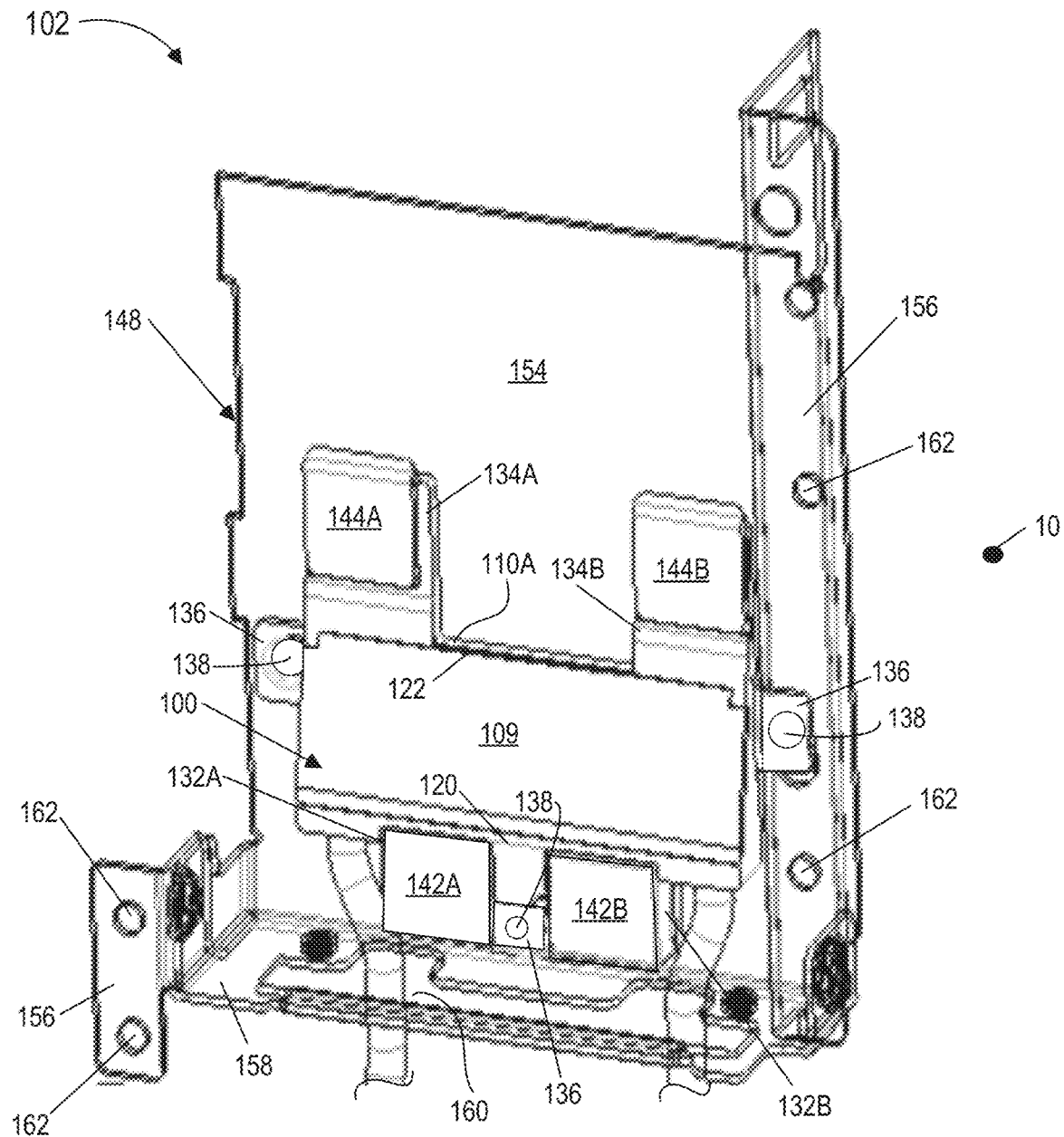
FIG. 1B illustrates a perspective view of a host device having the cooling component of FIG. 1A according to an example implementation of the present disclosure.

FIG. 1A depicts a perspective view of a cooling component 100 of a host device 102 (shown in FIG. 1B). In the example of FIG. 1A, the cooling component 100 is a cold plate. In some non-limiting examples, the cooling component 100 may be a heat sink. In one or more examples, the cooling component 100 is a thermally conductive component, which may be disposed in thermal communication with a heat spreader 104 (shown in FIGS. 2A and 2B), and may include provisions to allow a liquid coolant to flow through it for dissipating waste-heat from the cooling component 100.

In the example of FIG. 1A, the cooling component 100 is a rectangular wedge-shaped hollow component. In such examples, the cooling component 100 may be formed by a cover having a top surface 109 (or a first surface), a base having a bottom surface 111, a pair of first peripheral walls 112, and a pair of second peripheral walls 114. For example, each wall of the pair of first and second peripheral walls 112, 114 may be disposed on and coupled to a perimeter of the base, and the cover may be disposed over the pair of first and second peripheral walls 112, 114 to form a hollow space there between. In some examples, a first wall 112A of the pair of first peripheral walls 112 has a first height "$H_1$", and a second wall 112B of the pair of first peripheral walls 112 has a second height "$H_2$", where the first height "$H_1$" is greater than the second height "$H_2$". Further, a height of each wall of the pair of second peripheral walls 114 gradually decreases from a first end 116 to a second end 118 of the cooling component 100 (e.g., the second peripheral walls 114 can be sloped). In the example of FIG. 1A, the first surface 109 is a first tapered surface, and the bottom surface 111 is a flat surface. For example, the first tapered surface 109 extends between a first end 120 and a second end 122 of the cooling component 100. In the example of FIG. 1A, the first surface 109 tapers towards the second end 122 from the first end 120.

Further, the first wall 112A of the pair of first peripheral walls 112 has a fluid inlet 124 and a fluid outlet 126. In some examples, the cooling component 100 may further include an interior channel (not shown) disposed within the hollow space, and extending between the fluid inlet 124 and the fluid outlet 126, and such interior channel may be integral to a main body of the cooling component 100. In some examples, the interior channel may include features, such as fins, pin fin arrays, surface roughening to increase the amount of its surface area that is exposed to the liquid coolant. In some other examples, the interior channel may also include other features, such as turbulators that enhance turbulence in the flow of the liquid coolant. In one or more examples, the features that enhance the surface area or the turbulence may result in increasing thermal performance of the liquid coolant. In some other examples, the cooling component 100 may include a pipe or a tube that extends through the hollow space of the cooling component 100, where the pipe or the tube may be a distinct part from the main body of the cooling component 100.

In some examples, the fluid inlet 124 may be coupled to an inlet channel 128, and the fluid outlet 126 may be coupled to an outlet channel 130. In such examples, the fluid inlet 124 and the fluid outlet 126 may be sealed liquid tight to the inlet channel 128 and the outlet channel 130, respectively using sealant, for example, a gasket, an adhesive, an O-ring, or the like. In one or more examples, the inlet channel 128 may be further coupled to a supply line manifold (not shown) that is fluidically connected to a coolant distribution unit (not shown). Similarly, the outlet channel 130 may be further coupled to a return line manifold (not shown) that is fluidically connected to the coolant distribution unit. In some examples, the coolant distribution unit may be a rack-level liquid cooling system, a row-level liquid cooling system, a datacenter-level liquid cooling system, or the like. In one or more examples, the coolant distribution unit may include a pump (not shown) that is configured to supply the liquid coolant to the cooling component 100 via the supply line manifold and the inlet channel 128, and receive a heated liquid coolant from the cooling component 100 via the return line manifold and the outlet channel 130. It may be noted herein that the coolant distribution system may include a heat exchanger (not shown) to remove the waste-heat from the heated liquid coolant and regenerate the liquid coolant. The process of supplying the liquid coolant and receiving the heated liquid coolant may continue, as discussed herein above.

The cooling component 100 may further include a pair of first protruded portions 132 and a pair of second protruded portions 134. In some examples, the pair of first protruded portions 132 is coupled to the first end 120 of the cooling component 100, and the pair of second protruded portions 134 is coupled to the second end 122 of the cooling component 100, For example, the pair of first protruded portions 132 may be spaced apart from each other, disposed in-between the fluid inlet 124 and the fluid outlet 126, and coupled to the first wall 112A of the pair of first peripheral walls 112. Similarly, the pair of second protruded portions 134 may be spaced apart from each other, disposed at a respective end of the second wall 112B of the pair of first peripheral walls 112, and coupled to the second wall 112B. Additionally, the cooling component 100 may include a plurality of flanges 136. In some examples, each flange of the plurality of flanges 136 has a through opening 138. In such examples, one flange of the plurality of flanges 136 is coupled to one wall of the pair of second peripheral walls 114, and another flange of the plurality of flanges 136 is coupled to a first wall 112A of the pair of first peripheral walls 112. In some examples, the plurality of flanges 136 may be used to movably couple the cooling component 100 to a housing of the host device 102.

In some examples, the cooling component 100 may be formed of a highly thermally conductive material, such as copper, aluminum, or the like. The pair of first and second protruded portions 132, 134, and the plurality of flanges 136 may be formed of a ferrous material, such as steel or the like. The inlet channel 128 and the outlet channel 130 may be formed of a polymer material. Further, each of the inlet and outlet channels 128, 130, respectively may be a flexible channel.

In one or more examples, the host device 102 may further include a plurality of first blocks of magnetic materials. In some examples, the plurality of first blocks of magnetic materials includes a plurality of magnetic blocks 142 (or a plurality of first magnetic blocks) and a plurality of ferromagnetic blocks 144 (or a plurality of first ferromagnetic blocks). In some examples, each magnetic block of the plurality of magnetic blocks 142 may be a conventional magnet or a non-conventional magnet. Similarly, each ferromagnetic block of the plurality of ferromagnetic blocks 144 may be a steel block. In the example of FIG. 1A, the plurality of magnetic blocks 142 includes a first magnetic block 142A, and a second magnetic block 142B. It may be noted herein that the first magnetic block 142A and the second magnetic block 142B may be a single magnetic block, for example, a first unitary magnetic block. In some examples, each of the first magnetic block 142A and the second magnetic block 142B may be a permanent magnetic block. In some other examples, each of the first magnetic block 142A and the second magnetic block 142B may be a temporary magnetic block. In such examples, the temporary magnetic block may be supplied with an electric current to retain magnetism, as and when required. In the example of FIG. 1A, the first and second magnetic blocks 142A, 142B are disposed at the first end 120 of the cooling component 100. For example, the first and second magnetic blocks 142A, 142B are disposed on and coupled to a first protruded portion 132A and a second protruded portion 132B of the pair of first protruded portion 132. The plurality of ferromagnetic blocks 144 includes a first ferromagnetic block 144A, and a second ferromagnetic block 144B. In such examples, the first and second ferromagnetic blocks 144A, 144B are disposed at the second end 122 of the cooling component 100. For example, the first and second ferromagnetic blocks 144A, 144B are disposed on and coupled to a first protruded portion 134A and a second protruded portion 134B of the pair of second protruded portion 134.

In some non-limiting examples, the plurality of first blocks of magnetic materials may only include the plurality of magnetic blocks (i.e., without the plurality of ferromagnetic blocks 144 as discussed hereinabove). In such examples, the plurality of magnetic blocks may include the first magnetic block 142A and the second magnetic block 142B as discussed hereinabove, and additionally include a fifth magnetic block (not labeled) and a sixth magnetic block (not labeled) i.e., instead of the first and second ferromagnetic blocks 144A, 144B, respectively without deviating from the scope of the present disclosure. It may be noted herein that the fifth magnetic block and the sixth magnetic block may be a single magnetic block, for example, a third unitary magnetic block. In some examples, each of the fifth magnetic block and the sixth magnetic block may be a permanent magnetic block. In some other examples, each of the fifth magnetic block and the sixth magnetic block may be a temporary magnetic block. In such examples, the temporary magnetic block may be supplied with the electric current to retain magnetism, as and when required.

Figure 2A:
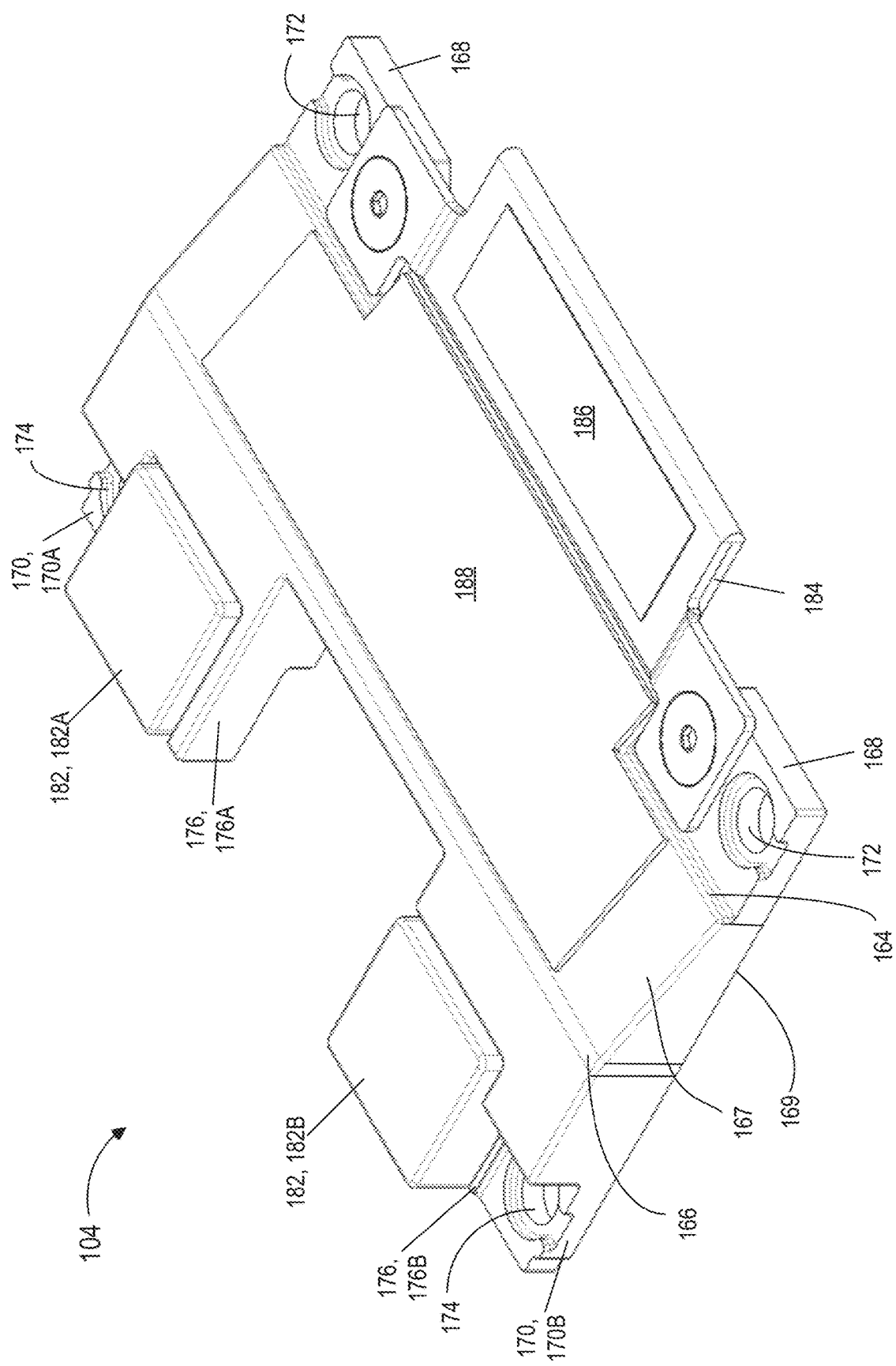
FIG. 2A illustrates a perspective view of a heat spreader according to an example implementation of the present disclosure.
Figure 3B:
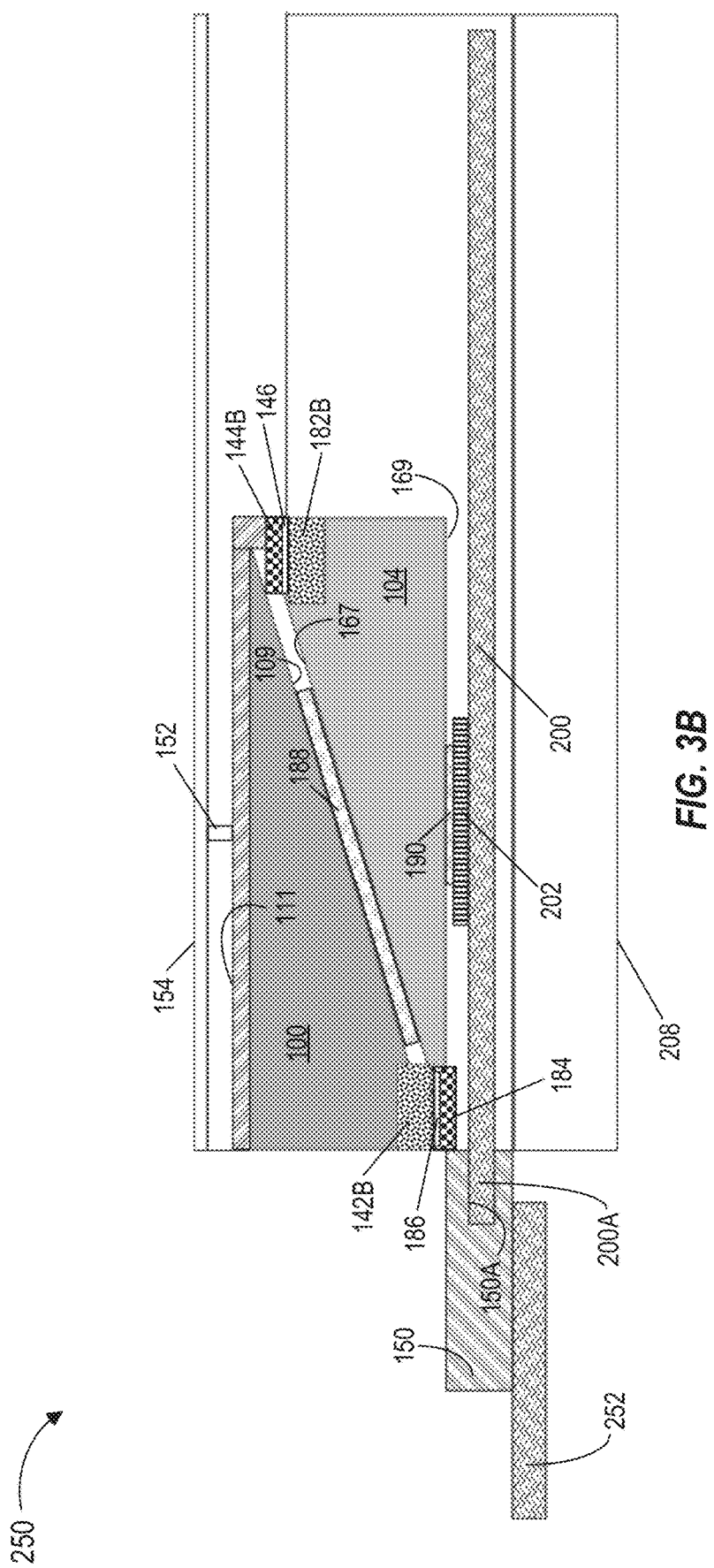
FIG. 3B illustrates a block diagram of an electronic system having a removable device connected to the host device of the electronic system according to an example implementation of the present disclosure.

In one or more examples, the plurality of first magnetic blocks 142, and the plurality of ferromagnetic blocks 144 may couple to a third ferromagnetic block 184 of a removable device 106 (as shown in FIGS. 2A and 2B) and a plurality of second magnetic blocks 182 of the removable device 106 (as shown in FIGS. 2A and 2B), respectively. Thus, causing the cooling component 100 to thermally couple to (or in thermal communication with) the heat spreader 104 of the removable device 106. In one or more examples, the host device 102 may further include a layer of insulation material 146 disposed on a surface, for example, a top surface of each of the first and second ferromagnetic blocks 144A, 144B. The layer of insulation material 146 may be non-ferrous material, such as formex material, polytetrafluoroethylene (PTFE) material, a polycarbonate material sheet, or the like. In some examples, the layer of insulation material 146 may is a thin layer, which may provide a low sliding friction performance there between the interfacing components. In other words, the layer of insulation material 146 may enable the interfacing components to slip (i.e., with substantially less friction there between the magnetic blocks and ferromagnetic blocks) during connecting or disconnecting of the removable and host devices 102, 106, respectively.

The cooling component 100 may create a thermally conductive (a low resistance) path between the heat spreader 104 and the liquid coolant, thus enabling a waste-heat to flow from the heat spreader 104 into the liquid coolant. For example, a thermally conductive portion of the cooling component 100 that is in thermal communication with (or otherwise thermally coupled to) the liquid coolant may be interposed between the heat spreader 104 and the liquid coolant, and the waste-heat may pass from the heat spreader 104 into the cooling component 100 and then into the liquid coolant. In some examples, the liquid coolant may flow through the cooling component 100 via the interior channel, while in other examples the liquid coolant may through the cooling component via the pipe or tube.

FIG. 1B depicts a perspective view of a host device 102. In one or more examples, the host device 102 may be a computing device, such as a server device, a storage device, a power conversion device, or a networking device, having a modular connector. In the example of FIG. 1A, the host device 102 is the networking device. The host device 102 includes a partially open housing 148, a connector 150 (shown in FIGS. 3A, 3B), a cooling component 100, a plurality of first blocks of magnetic materials, and a plurality of stand-offs 152 (shown in FIGS. 3A and 4A).

The housing 148 is defined by a cover 154, a pair of side rails 156, and a rear panel 158. Each side rail of the pair of side rails 156 is coupled to one peripheral side of the cover 154. The rear panel 158 is coupled to a rear side of cover 154 and to the pair of side rails 156. The rear panel 158 includes a cut-out 160 to allow the connector 150 to be inserted and coupled to the rear panel 158, Each side rail of the pair of side rails 156 includes a plurality of through openings 162 to allow the housing 148 to be coupled to a chassis (not shown) of the host device 102 using fasteners, such as screws or the like.

The connector 150 (or a modular port) of the host device 102 may receive the removable device 106 when it is connected to the host device 102. For example, the connector 150 may have a slot (or socket) to receive a plug (i.e., a portion of a circuit board (not shown) of the removable device 106, and to communicatively couple the removable device 106 to the host device 102. In some examples, the connector 150 may be a networking device connector, a USB connector, a peripheral-component interconnect express (PCIe) connector, or the like. It may be noted herein that the terms "connector" and "modular port" may be used interchangeably. In the example of FIGS. 1B and 3B, the connector 150 is a network switch that may allow the removable device 106 to be detachably coupled to the host device 102.

As discussed hereinabove in the example of FIG. 1A, the cooling component 100 may be movably coupled to the housing 148. For example, when the cooling component 100 is movably coupled to the housing 148, a first tapered surface 109 of the cooling component 100 may face the heat spreader, and a flat surface 111 of the cooling component 100 may face the cover 154. In such examples, the plurality of flanges 136 may allow the cooling component 100 to be movably coupled to the housing 148 via the plurality of stand-offs 152. For example, each stand-off of the plurality of stand-offs 152 may be inserted through a respective through opening 138 of each flange 136, and coupled to the cover 154 such that the cooling component 100 may move along a radial direction 10 relative to the plurality of stand-offs 152. It may be noted herein that the details about movably coupling the cooling component 100 to the housing 148 is discussed in the example of FIG. 4A.

Further, as discussed hereinabove in the example of FIG. 1A, the first and second magnetic blocks 142A, 142B are disposed at the first end 120 of the cooling component 100. Similarly, the first and second ferromagnetic blocks 144A, 144B are disposed at the second end 122 of the cooling component 100. Further, the first magnetic block 142A is coupled to the first protruded portion 132A and the second magnetic block 142B is coupled to the second protruded portion 132B of the pair of first protruded portions 132 of the cooling component 100. Similarly, the first ferromagnetic block 144A is coupled to the first protruded portion 134A and the second ferromagnetic block 144B is coupled to the second protruded portion 134E of the pair of second protruded portions 134 of the cooling component 100. It may be noted herein that the layer of insulation material 146 (shown in FIG. 1A) disposed on the surface of each of the first and second ferromagnetic blocks 144A, 144B is not shown in FIG. 1B for the purpose of ease of illustration and such an example should not be construed as a limitation of the present disclosure.

FIG. 2A depicts a perspective view of a heat spreader 104 of a removable device 106 (shown in FIG. 2B). The heat spreader 104 is a thermally conductive component, which may establish a thermal communication with a heat source, for example, a circuit board 200 (shown in FIGS. 3A, 3B) of the removable device 106, and/or one or more electronic components 202 (shown in FIGS. 3A, 3B) mounted on the circuit board 200. Further, when the removable device 106 is connected to the host device 102 (shown in FIGS. 1A and 1B), the heat spreader 104 may additionally establish the thermal communication with the cooling component 100 (shown in FIGS. 1A, 1B) of the host device 102.

In the example of FIG. 2A, the heat spreader 104 is a rectangular wedge-shaped solid component. In such examples, the heat spreader 104 may have a first end 164 and a second end 166, where a height of the second end 166 is substantially greater than a height of the first end 164. Further, the heat spreader 104 has a second surface 167 and a third surface 169, each extending between the first and second ends 164, 166, respectively. For example, the second surface 167 is a second tapered surface, and the third surface 169 is a flat surface. For example, the second tapered surface 169 extends between the first end 164 and the second end 166 of the heat spreader 104. In the example of FIG. 2A, the second surface 169 tapers towards the first end 164 from the second end 166. In one or more examples, a first tapered surface 109 (shown in FIGS. 1A and 1B), and the second tapered surface 167 are complementary surfaces to one another.

The heat spreader 104 may further include a pair of first flanges 168 and a pair of second flanges 170. Each flange of the pair of first flanges 168 has a through opening 172, and each flange of the pair of second flanges 170 has a through opening 174. The pair of first flanges 168 is coupled to the first end 164 of the heat spreader 104, and the pair of second flanges 170 is coupled to the second end 166 of the heat spreader 104. In some examples, the pair of first flanges 168 and the pair of second flanges 170 may allow the heat spreader 104 to be coupled to a circuit board 200 (shown in FIG. 4) using a plurality of spring loaded shoulder screws 206 (shown in FIG. 2B). Further, the heat spreader 104 include a pair of protruded portions 176 coupled to the second end 166 of the heat spreader 104, where the pair of protruded portions 176 is spaced apart from one another, disposed in-between the pair of second flanges 170, and coupled to the second end 166 of the heat spreader 104 and to a corresponding flange of the pair of second flange 170.

In some examples, the heat spreader 104 may be formed of a highly thermally conductive material, such as copper, aluminum, or the like. The pair of protruded portions 176, and the pair of first and second flanges 168, 170, respectively may be formed of a ferrous material, such as steel or the like.

In one or more examples, the removable device 106 includes a plurality of second blocks of magnetic materials. In some examples, the plurality of second blocks of magnetic materials includes a plurality of magnetic blocks 182 (also known as a plurality of second magnetic blocks) and a ferromagnetic block 184 (also known as a third ferromagnetic block). In some examples, each magnetic block of the plurality of magnetic blocks 182 may be a conventional magnet or a non-conventional magnet. Similarly, the ferromagnetic block 184 may be a steel block. In the example of FIG. 2A, the plurality of magnetic blocks 182 includes a third magnetic block 182A and a fourth magnetic block 182B. It may be noted herein that the third magnetic block 182A and the fourth magnetic block 182B may be a single magnetic block, for example, a second unitary magnetic block. In some examples, each of the third magnetic block 182A and the fourth magnetic block 182B may be a permanent magnetic block. In some other examples, each of the third magnetic block 182A and the fourth magnetic block 182B may be a temporary magnetic block. In such examples, the temporary magnetic block may be supplied with an electric current to retain magnetism, as and when required. In the example of FIG. 2A, the third and fourth magnetic blocks 182A, 182B are disposed at the second end 166 of the heat spreader 104. For example, the third and fourth magnetic blocks 182A, 182B are disposed on and coupled to a first protruded portion 170A and a second protruded portion 170B of the pair of protruded portions 170. Further, the third ferromagnetic block 184 is disposed at the first end 164 of the heat spreader 104. For example, the third ferromagnetic block 184 is disposed at the first end 164 of the heat spreader 104 such that a portion of the third ferromagnetic block 184 protrudes over each flange of the pair of first flanges 168. In such examples, the third ferromagnetic block 184 is further coupled to the first end 164 of the heat spreader 104, and to the pair of first flanges 168 via fasteners (not shown).

In some non-limiting examples, the plurality of second blocks of magnetic materials may only include the plurality of magnetic blocks (i.e., without the ferromagnetic block 184 as discussed hereinabove). In such examples, the plurality of magnetic blocks may include the third magnetic block 182A and the fourth magnetic block 182B as discussed hereinabove, and additionally include a seventh magnetic block (not labeled) i.e., instead of the third ferromagnetic block 184 without deviating from the scope of the present disclosure. It may be noted herein that the seventh magnetic block may also be referred to as a fourth unitary magnetic block. In some examples, the seventh magnetic block may be a permanent magnetic block. In some other examples, the seventh magnetic block may be a temporary magnetic block. In such examples, the temporary magnetic block may be supplied with the electric current to retain magnetism, as and when required.

In one or more examples, the plurality of second magnetic blocks 182 and the third ferromagnetic block 184 may couple to the plurality of first ferromagnetic blocks 144 of the host device 102 (as shown in FIGS. 1A and 1B) and a plurality of first magnetic blocks 142 of the host device 102 (as shown in FIGS. 1A and 1B), respectively. Thus, causing the heat spreader 104 to thermally couple to (or in thermal communication with) the cooling component 100 of the host device 102. In some examples, the removable device 104 may further include a layer of insulation material 186 disposed on a top surface of third ferromagnetic block 184. The layer of insulation material 186 may be non-ferrous material, such as formex material, polytetrafluoroethylene (PTFE) material, a polycarbonate material sheet, or the like. In some examples, the layer of insulation material 186 may is a thin layer, which may provide a low sliding friction performance there between the interfacing components. In other words, the layer of insulation material 186 may enable the interfacing components to slip (i.e., with substantially less friction there between the magnetic blocks and ferromagnetic blocks) during connecting or disconnecting of the removable and host devices 102, 106, respectively.

The removable device 104 may further include a first thermal interface material (TIM) 188 disposed on the second surface 167 of the heat spreader 104 and a second TIM 190 (shown in FIGS. 3A, 3B) disposed on the third surface 169 of the heat spreader 104. The first TIM 188 may refer to a relatively thin, thermally conductive, and compliant (easily deformable) material placed between two devices, for example, the cooling component 100 and the heat spreader 104, at their thermal interface to improve heat transfer rates by filling air gaps that would otherwise occur between the devices due to surface roughness and/or misalignment. Similarly, the second TIM 190 may also refer to a relatively thin, thermally conductive, and compliant (easily deformable) material placed between two devices, for example, the heat spreader 104 and the circuit board 200 and/or the one or more electronic components 202, at their thermal interface to improve heat transfer rates by filling air gaps that would otherwise occur between the devices due to surface roughness and/or misalignment. Common examples of the first and second TIMs 188, 190 may include thermal gap pads, thermal grease, thermal paste, or the like. In some examples, each of the first and second TIMs 188, 190 may be a polymer matrix, such as an epoxy or silicone resin, and thermally conductive fillers such as boron nitride, alumina, aluminum, zinc oxide, silver, or the like.

In one or more examples, a first thermally conductive (a low resistance) path may be created between the heat source, such as the circuit board 200 and/or the one or more electronic components 202, and the heat spreader 104 via the second TIM 190. Similarly, a second thermally conductive path may be created between the heat spreader 104 and the cooling component 100 via the first TIM 188. Further, a third thermally conductive path may be created between the cooling component 100 and the liquid coolant circuited within the cooling component 100. Thus, enabling dissipation of the waste-heat from the circuit board 200 and/or the electronic components 202 and/or the BGA (not shown) to the heat spreader 104, transfer of the waste-heat from the heat spreader 104 to the cooling component 102, and the dissipation of the waste-heat from the cooling component 100 to the liquid coolant.

FIG. 2B depicts a perspective view of a removable device 106. In one or more examples, the removable device 106 may be a connectable electronic device (or a pluggable electronic device), for example, a communication module or a storage module. In some examples, the communication module may be a small form-factor pluggable (SFP) transceiver, a quad small form-factor pluggable transceiver coupled to an AOC, or the like. Similarly, the storage module may be a non-volatile memory express (NVMe) storage drive, or the like. It may be noted herein that the terms "removable device", "removable electronic device", "pluggable removable device", and "connectable electronic device" may be used interchangeably.

The removable device 106 includes a partially open housing 192, a plurality of external connectors 194, a pair of latches 196, an optical assembly 198, a circuit board 200, one or more electronic components 202 (shown in FIGS. 3A, 3B) coupled to the circuit board 200, a heat spreader 104, and a plurality of second blocks of magnetic materials.

The housing 192 is defined by a base 208, a pair of peripheral walls 210, and a rear panel 212. Each wall of the pair of peripheral walls 210 is coupled to one peripheral side of the base 208. The rear panel 212 is coupled to a rear side of the base 208 and to the pair of peripheral walls 210. The rear panel 212 may include a cut-out (not shown) to allow the pair of external connectors 194 to be inserted and coupled to the circuit board 200 and/or to the optical assembly 198. Each wall of the pair of peripheral walls 210 includes a plurality of through openings 214 to allow a corresponding latch of the pair of latches 196 to be coupled to the housing 192 of the removable device 106. Hence, the pair of latches 196 may prevent the removable device 106 to be pushed out from the host device 102 by the magnet forces applied by the magnetic blocks 142, 182 of the host and removable devices 102, 106, thus aiding to maintain the compression force on the first TIM 188 to form the thermal communication between the first and second surfaces 109, 167, respectively.

Each external connector of the pair of external connectors 194 may receive an optical cable, or the like. For example, each external connector 194 may have a slot (or socket) to receive the optical cable and to communicatively couple the optical cable to the host device 102 via the removable device 106. In some examples, the circuit board 200 may be a rectangular or square shaped semiconductor component disposed on and coupled to the base 208 of the housing 192. The one or more electronic components 202 may be mounted on and coupled to the circuit board 200. In some examples, the one or more electronic components 202 may include a processor 202A (shown in FIGS. 3A, 3B), capacitors, resistors, or the like.

As discussed hereinabove, the heat spreader 104 is mounted on the circuit board 200 and/or the one or more electronic components 202, For example, the second tapered surface 167 of the heat spreader 104 may face the cooling component 100, and the flat surface 169 of the heat spreader 104 may face the circuit card 104. Further, the heat spreader 104 may be coupled to the base 208 of the housing 192 via the circuit board 200 using the plurality of spring loaded shoulder screws 206. In such examples, the plurality of spring loaded shoulder screws 206 is inserted via the plurality of through openings 172, 174 of the pair of first and second flanges 168, 170, respectively of the heat spreader 104 to couple the heat spreader 104 to the base 208. In some examples, the heat spreader 104 is in thermal communication with the circuit board 200 and/or the one or more electronic components 202. For example, each of the plurality of spring loaded shoulder screws 206 may exert an optimal load/force on the heat spreader 104 such that a third surface 169 (shown in FIGS. 3A, 3B) of the heat spreader 104 is in thermal communication with the one or more electronic components 202 or the circuit board 200 via the second TIM 190 (shown in FIGS. 3A, 3B).

Further, as discussed hereinabove in the example of FIG. 2A, the third and fourth magnetic blocks 182A, 182B are disposed at the second end 166 of the heat spreader 104. Similarly, the third ferromagnetic block 184 is disposed at the first end 164 of the heat spreader 104. Further, the third magnetic block 182A is coupled to the first protruded portion 176A and the fourth magnetic block 182B is coupled to the second protruded portion 176B of the pair of protruded portions 176 of the heat spreader 104. Similarly, the third ferromagnetic block 184 is coupled to the first end 164 of the heat spreader 104, and to the pair of first flanges 168 via fasteners (not shown). It may be noted herein that the layer of insulation material 186 (shown in FIG. 2A) disposed on the top surface of each of the third ferromagnetic block 184 is not shown in FIG. 2B for the purpose of ease of illustration and such an example should not be construed as a limitation of the present disclosure.

FIG. 3A depicts a sectional side view of an electronic system 250 having a removable device 106 disconnected from a host device 102 of the electronic system 250. FIG. 3B depicts a block diagram of the electronic system 250 having the removable device 106 connected to the host device 102 of the electronic system. In some example, the electronic system 250 is a compute infrastructure, such as a rack or an enclosure of a data center having the host device 102, such as a server device, a storage device, a power conversion device, or a networking device, and the removable device 106, such as a data communication device, or a storage drive. In one or more examples, the removable device 106 and the host device 102 may function as a plug and a socket of the compute infrastructure. In the example of FIG. 3A, the host device 102 is the networking device having a connector 150, and the removable device 106 is the data communication device having a transceiver. In some examples, the connector 150 may be an Ethernet switch, and the transceiver may be a small form-factor pluggable (SFP) transceiver coupled to an active optical cable (AOC, not shown) or a Quad small form-factor pluggable (QSFP) transceiver coupled to the AOC.

As discussed in the examples of FIGS. 1A and 1B, the host device 102 includes a partially open housing 148, a connector 150, a cooling component 100, a plurality of first blocks of magnetic materials, and a plurality of stand-offs 152. The cooling component 100 is movably coupled to a cover 154 of the housing 148 via the plurality of stand-offs 152. Further, the cooling component 100 includes a first surface 109, for example a first tapered surface. The plurality of first blocks of magnetic materials includes a first magnetic block 142A (shown in FIGS. 1A, 1B), a second magnetic block 142B, a first ferromagnetic block 144A (shown in FIGS. 1A, 1B, and 3B), and a second ferromagnetic block 144B. The first and second magnetic blocks 142A, 142B are disposed spaced apart from one another and coupled to a first end 120 of the cooling component 100, and the first and second ferromagnetic blocks 144A, 144B are disposed spaced apart from one another and coupled to a second end 122 of the cooling component 100.

Further, as discussed in the examples of FIGS. 2A and 2B, the removable device 106 includes a partially open housing 192, a plurality of external connectors 194, a pair of latches 196, an optical assembly 198, a circuit board 200, one or more electronic components 202 (shown in FIGS. 3A, 3B) coupled to the circuit board 200, a heat spreader 104, and a plurality of second blocks of magnetic materials. In some examples, the heat spreader 104 is coupled to a base 208 of the housing 192 via a circuit board 200 using a plurality of spring loaded shoulder screws 206. Each of the plurality of spring loaded shoulder screws 206 may exert an optimal load/force on the heat spreader 104 such that a third surface 169 of the heat spreader 104 is in thermal communication with the one or more electronic components 202 via a second TIM 190. Further, the heat spreader 104 includes a second surface 167, for example a second tapered surface. The plurality of second blocks of magnetic materials includes a third magnetic block 182A (shown in FIGS. 2A and 2B), a fourth magnetic block 182B, and a third ferromagnetic block 184. The third and fourth magnetic blocks 182A, 182B are disposed spaced apart from each other and coupled to a second end 166 of the heat spreader 104, and the third ferromagnetic block 184 is coupled to a first end 164 of the heat spreader 104.

As discussed hereinabove, in some non-limiting examples, the host device 102 may include the first magnetic block 142A, the second magnetic block 142B, a fifth magnetic block, and a sixth magnetic block. Similarly, the removable device 105 may include the third magnetic block 182A, the fourth magnetic block 182B, and a seventh magnetic block. It may be noted that the first and second magnetic blocks 142A, 142B may be a single magnetic block, for example, a first unitary magnetic block. The third and fourth magnetic blocks may also be a single magnetic block, for example, a third unitary magnetic block. Similarly, the second and fourth magnetic blocks 182A, 182B may also be a single magnetic block, for example, a second unitary magnetic block. The seventh magnetic block may be referred to as a fourth unitary magnetic block.

Referring to FIGS. 3A and 3B, the removable device 106 may be slidably inserted into the housing 148 of the host device 102 so as to detachably couple the removable device 106 to the host device 102. For example, when the removable device 106 is connected to the host device 102, a portion 200A of a circuit board 200 of the removable device 106 is plugged into a slot 150A (shown in FIG. 3B) of the connector 150 of the host device 102. In other words, the circuit board 200 of the removable device 106 may be communicatively coupled to a circuit board 252 of the host device 102 via the connector 150. Accordingly, when the removable device 106 is connected to the host device 102, it may be held in non-movable condition, because the portion 200A of the circuit board 200 is plugged into the slot 150A of the connector 150. In such examples, the first and second magnetic blocks 142A, 142B, respectively of the host device 102 may apply magnetic forces to couple to the third ferromagnetic block 184 of the removable device 106. In addition, the third and fourth magnetic blocks 182A, 182B, respectively of the removable device 106 may apply magnetic forces to couple to the first and second ferromagnetic blocks 144A, 144B, respectively. In all such examples, the first and second magnetic blocks 142A, 142B may align with the third ferromagnetic block 184, and the third and fourth magnetic blocks 182A, 182B, respectively may align with the first and second ferromagnetic blocks 182A, 182B, respectively such that the first surface 109 is in thermal communication with the second surface 167 through the first TIM 188. In some examples, when the first, second, third, and fourth magnetic blocks 142A, 142B, 182A, 182B, respectively applies the magnetic forces, the cooling component 100 moves downwards relative to the plurality of stand-offs 152 and compresses the first TIM 188 in order to establish the thermal communication between the first and second surfaces 109, 167, respectively and also for self-centring alignment of the magnetic blocks.

In some non-limiting examples, the first and second magnetic blocks 142A, 142B may couple (i.e., direct coupling and not an indirect coupling via a layer of insulation material 186, as discussed in FIGS. 3A and 3B) to the seventh magnetic block (i.e., instead of third ferromagnetic block 184). Similarly, the fifth and sixth magnetic blocks (i.e., instead of the first and second ferromagnetic blocks 144A, 144B) may couple (i.e., direct coupling and not an indirect coupling via a layer of insulation material 146, as discussed in FIGS. 3A and 3B) to the third and fourth magnetic blocks 182A, 184B, respectively. Thereby causing the cooling component 100 to thermally couple to (or in thermal communication with) the heat spreader 104. In other words, the first unitary magnetic block may couple to the fourth unitary magnetic block, and the third unitary magnetic block may couple to the second unitary magnetic block, thereby causing the cooling component 100 to thermally couple to the heat spreader 104. In all such examples, the first and second magnetic blocks 142A, 142B and the seventh magnetic block may have opposite poles (in case of conventional magnets) or magnetic pole patterns (in case on non-conventional magnets) facing each other such that they may attract each other for coupling to one another. Similarly, the third and fourth magnetic blocks 182A, 182B and the fifth and sixth magnetic blocks may have opposite poles or magnetic pole patterns facing each other such that they attract each other for coupling to one another. Accordingly, in some example, the magnetic forces generated by the magnetic blocks may be sufficient to compress the first TIM 188 and form the thermal communication between the first and second surfaces 109, 167, respectively and also for self-centring alignment of the magnetic blocks.

It may be noted herein that compression of the first TIM 188 may result in forming a thermal contact (i.e., either a direct contact or an indirect contact) between the two devices, for example, the cooling component 100 and the heat spreader 104, so as to thermally couple the two device to one another. As used herein, the term "thermally couple" two devices means to provide a thermally conductive pathway between the devices that allows heat to be conducted between the devices. Two devices or objects or entities may be considered to be thermally coupled if any of the following are true: (1) the two objects are in contact with one another (either direct contact, or contact via a TIM), (2) the objects are both thermally coupled to the same thermal transfer device or to a chain of thermally coupled thermal transfer devices, or (3) a heat transfer coefficient between the two objects is $10 \text{ W} \cdot \text{m}^{-2} \cdot \text{K}^{-1}$ or greater.

In some examples, when each of the first, second, third, and fourth magnetic blocks 142A, 142B, 182A, 182B, respectively and the fifth, sixth, and the seventh magnetic blocks are not a permanent magnetic blocks (i.e., when all of those magnetic blocks are temporary magnetic blocks), then an electric current may be supplied to those temporary magnetic blocks to retain magnetism, after the removable device 106 is connected to the host device 102. Further, the supply of the electric current to those temporary magnetic blocks may be stopped, when the removable device 106 needs to be disconnected from the host device 102.

In some examples, a layer of insulation material 146 applied on the first and second ferromagnetic blocks 144A, 144B may form a gap there between the third and fourth magnetic blocks 182A, 182B and the first and second ferromagnetic blocks 144A, 144B. Similarly, a layer of insulation material 186 applied on the third ferromagnetic block 184 may form a gap there between the first and second magnetic blocks 142A, 142B and the third ferromagnetic block 184. In such examples, the layer of insulation materials 146, 186 may enable the interfacing components [i.e., i) the first and second ferromagnetic blocks 144A, 144B and the third and fourth magnetic blocks 182A, 182B, and ii) the first and second magnetic blocks 142A, 142B and the third ferromagnetic block 184] to slip through (i.e., with substantially less friction) during connecting or disconnecting of the removable device 106 and the host device 102. Hence, preventing the load of the interfacing components (i.e., the cooling component 100 and the heat spreader 104 to be transferred to the one or more electronic components 202, the circuit board 200, and a ball grid array (BGA) and damage to those components. Further, the layer of insulation layers 146, 186 may prevent impact damages on the first, second, third, and fourth magnetic blocks 142A. 142B, 182A, 182B, which may occur due to the coupling to the first, second, and third ferromagnetic blocks 144A, 144B, 184.

In some examples, the magnetic forces applied by the first blocks of magnetic materials and the second blocks of magnetic materials are equal and opposite between the cooling component 100 and the heat spreader 104 such that they form a closed system in which the magnetic forces cancel out, and result in zero net magnetic forces exerted on the circuit board 200, the one or more electronic components 202, or the BGA. In other words, the first blocks of magnetic materials of the cooling component 100 may apply magnetic forces to pull up the second blocks of magnetic materials of the heat spreader 104, which may be exactly equal to the magnetic forces applied by the second blocks of magnetic materials of the heat spreader 104 to pull down the first blocks of magnetic materials of the cooling component 100, thereby resulting in zero net magnetic forces exerted on the circuit board 200, the one or more electronic components 202, or the BGA. Hence, preventing the load of the interfacing components (i.e., the cooling component 100 and the heat spreader 104) to be transferred to the one or more electronic components 202, the circuit board 200, and a ball grid array (BGA) used to mount the one or more electronic components 202 to the circuit board 200, and damage to those components.

In one or more examples, the amount of magnetic forces applied by the first and second magnetic blocks 142A, 142B and/or the third and fourth magnetic blocks 182A, 182B may be further regulated based on at least one of a size of each of the magnetic blocks, and/or shape of the each of the magnetic blocks, grade of each of the magnetic blocks, or an arrangement of magnetic poles in each of the magnetic blocks. In some examples, each of the plurality of magnetic blocks 142A, 142B, 182A, and 182B may have a rectangular or square shape, a size is about 10 mm to 20 mm, and grade is of N52 for generating a substantially sufficient strength to couple with a relatively thinner ferromagnetic blocks 144A, 144B, and 184. Further, each magnetic poles of each of the plurality of magnetic blocks 142A, 142B, 182A, and 182B may be arranged closer and in unique pattern, (as shown in FIG. 4B) for generating the substantially sufficient strength to couple with the ferromagnetic blocks 144A, 144B, and 184.

Since, the first surface 109 of the cooling component 100 and the second surface 167 of the heat spreader 104 are complementary tapered surfaces, the host device 102 does not interfere the plugging of the removable device 106 until it is fully inserted into the host device 102. Further, since the magnetic blocks 142A, 142B, 182A, and 182B are disposed at a rear end of the cooling component 100 and the heat spreader 104, such magnetic blocks 142A, 142B, 182A, and 1828 does not interfere with the removable device 106, until it is fully inserted into the host device 102. Thus, the aforementioned features of the removable and host devices 106, 102 may allow the host device 102 to maintain an optimal resistive force against an insertion force or withdrawal force by the removable device 106, which is within acceptable safety limits to avoid repetitive force (e.g., insertion force or withdrawal force) related injuries.

Now referring to FIG. 3B, when the removable device 106 is connected to the host device 102. The removable device 106 may transmit, receive, process, or store data. Accordingly, the removable device 106 may consume a greater amount of power, and may thereby produce an increased amount of the waste-heat. In such examples, the heat spreader 104 coupled to the one or more electronic components 202 and/or the circuit board 200 may generate waste-heat. In such examples, the heat spreader 104 may dissipate the waste-heat from those devices 200, 202 via the second TIM 190 and third surface 169 towards the second surface 167 of the removable device 106. The cooling component 100 may transfer the waste-heat from the heat spreader 106 via the second surface 167, the first TIM 188, and the first surface. Further, the coolant liquid (not shown) flowing in the cooling component 100 may dissipate the waste-heat from the cooling component 100.

Figure 4A:
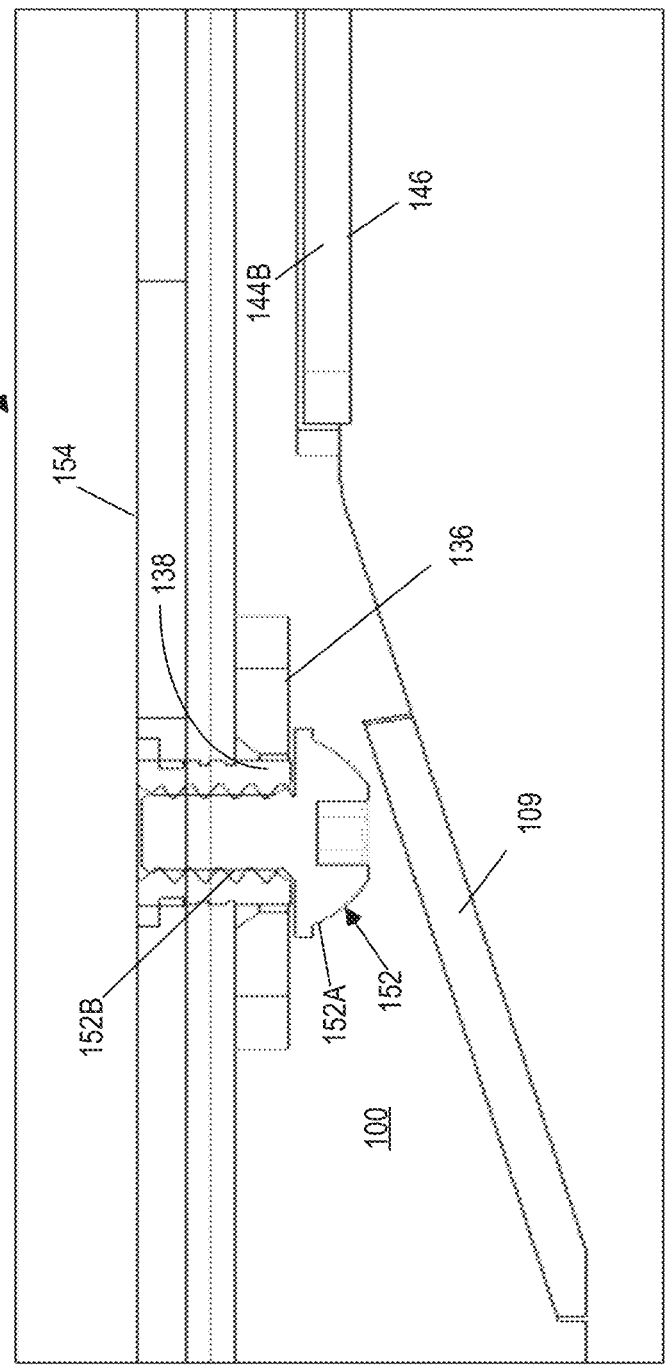
FIG. 4A illustrates a schematic diagram of a portion of a cooling component coupled to a housing of a host device according to an example implementation of the present disclosure.
Figure 4B:
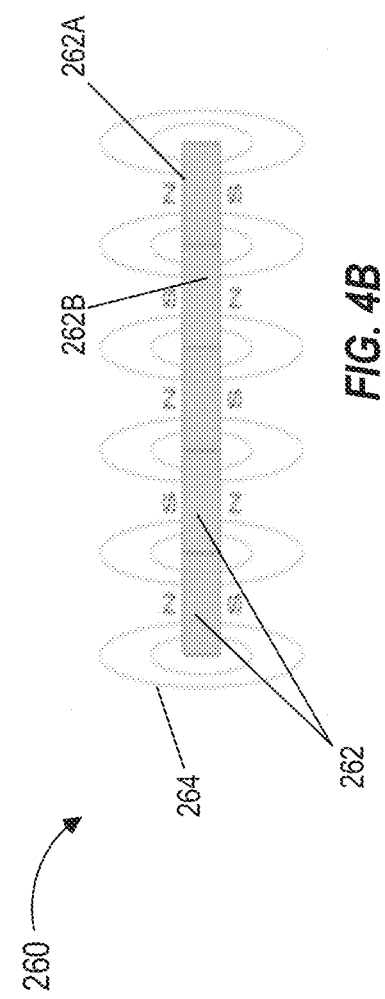
FIG. 4B illustrates a block diagram of a non-conventional magnet according to an example implementation of the present disclosure.

FIG. 4A depicts a perspective view of a portion of a cooling component 100 coupled to a housing 148 of a host device 102. In some example, a stand-off 152 is inserted via a through opening 138 of the flange 138 and coupled to a cover 154 of the housing 148. In such examples, the stand-off has a head portion 152A having a diameter that is substantially greater than a diameter of the through opening 138 of the flange 136, thereby coupling the cooling component 100 to the housing 148. Similarly, the stand-off 152 has a body portion 152B having a diameter that is substantially smaller than the diameter of the through-opening 138 of the flange 136, thereby allowing the cooling component 100 to move relative to the stand-off 152. In such examples, when the magnetic forces are applied by the plurality of magnetic blocks, for example, the first and second magnetic blocks 142A, 142B or the third and fourth magnetic blocks 182A and 182B (shown in FIGS. 1A, 1B, 2A, and 2B), the cooling component 100 may move upwards/downwards relative to the stand-off 152 in order to compress the first TIM 188 and thermally couple the first surface 109 to the second surface 167 via the first TIM 188.

FIG. 4B depicts a block diagram of a non-conventional magnet 260, In some examples, the non-conventional magnet 260 may be at least one of a first magnetic block 142A, a second magnetic block 142B, a third magnetic block 182A, or a fourth magnetic block 182B. In some non-limiting example, the non-conventional magnet 260 may also be at least one of a fifth magnetic block, a sixth magnetic block, and a seventh magnetic block. In one or more examples, the non-conventional magnet 260 may be made by attaching a plurality of magnetic blocks 262 to one another. In some examples, the plurality of magnetic blocks 262 may be arranged adjacent to each other such that a mutually adjacent magnetic block has opposite pole on a top side. For example, a first magnetic block 262A has a north pole on the top side, and the mutually adjacent magnetic block 262B has a south pole on the top side, Hence, the non-conventional magnet 260 having such unique combinations (or arrangements) of poles may be able to control an amount of magnetic forces applied for coupling to the ferromagnetic block. Also, the non-conventional magnet 260 has a short magnetic field range 264 in comparison with a conventional magnet (not shown) and have a substantially high strength for holding to the ferromagnetic block. Thus, the non-conventional magnet 260 may have relatively less magnetic field impact on any farther ferromagnetic structures/blocks when the removable device 106 is coupled to the host device 102.

Various features as illustrated in the examples described herein may be implemented in a system, such as an electronic system having a host device for a thermal management of a removable device. In one or more examples, the plurality of blocks of magnetic materials used in the host device and the removable device may generate an optimal force to compress a thermal interface material and establish and maintain thermal communication between a cooling component of the host device and a heat spreader of the removable device. Further, the magnetic forces may be controlled to prevent the transfer of load of interfacing components (i.e., cooling component and heat spreader) to other components of the removable device, and damages to those components.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. An electronic system comprising:
   a host device comprising a cooling component having a first surface, and a plurality of first blocks of magnetic materials coupled to the cooling component; and
   a removable device comprising a heat spreader having a second surface, a plurality of second blocks of magnetic materials coupled to the heat spreader, and a first thermal interface material (TIM) disposed on the second surface,
   wherein the removable device is detachably connectable to the host device, wherein when the removable device is connected to the host device, and magnetic forces applied by at least one of the plurality of first blocks or the plurality of second blocks to couple respective blocks to each other, the plurality of first blocks is aligned with the plurality of second blocks such that the first surface is in thermal communication with the second surface through the first TIM, and wherein the first surface is a first tapered surface extending between a first end and a second end of the cooling component, wherein the second surface is a second tapered surface extending between a first end and a second end of the heat spreader, and wherein the first and second tapered surfaces are complementary surfaces to one another.

2. The electronic system of claim 1, wherein each of the plurality of first and second blocks of magnetic materials comprise at least one of a plurality of ferromagnetic blocks or a plurality of magnetic blocks.

3. The electronic system of claim 2, wherein the removable device further comprises a layer of insulation material disposed on a surface of each of the plurality of ferromagnetic blocks interfacing with a corresponding magnetic block of the plurality of magnetic blocks to form a gap there between the ferromagnetic block and the corresponding magnetic block.

4. The electronic system of claim 2, wherein the magnetic forces applied by the plurality of magnetic blocks are controllable based on at least one of a size and/or shape of the magnetic block, a grade of the magnetic block, or an arrangement of magnetic poles of the magnetic block.

5. The electronic system of claim 4, wherein each of the plurality of magnetic block is a non-conventional magnet.

6. The electronic system of claim 2, wherein the plurality of ferromagnetic blocks comprises a first ferromagnetic block, a second ferromagnetic block, and a third ferromagnetic block, and wherein the plurality of magnetic blocks comprises a first magnetic block, a second magnetic block, a third magnetic block, and a fourth magnetic block.

7. The electronic system of claim 6, wherein the first and second magnetic blocks are disposed spaced apart from each other and coupled to a first end of the cooling component, wherein the first and second ferromagnetic blocks are disposed spaced apart from each other and coupled to a second end of the cooling component, wherein the third and fourth magnetic blocks are disposed spaced apart from each other and coupled to a second end of the heat spreader, and the third ferromagnetic block is coupled to a first end of the heat spreader.

8. The electronic system of claim 1, wherein the cooling component is movably coupled to a housing of the host device via a plurality of stand-offs, and wherein when the magnetic forces applied by the at least one of the plurality of first blocks or the plurality of second blocks for coupling to each other, the cooling component moves relative to the plurality of stand-offs and compresses the first TIM in order to establish the thermal communication between the first and second surfaces.

9. The electronic system of claim 1, wherein the host device further comprises a connector rigidly coupled to the housing, wherein the removable device further comprises a circuit board and one or more electronic components coupled to the circuit board, and wherein a portion of the circuit board is coupled to the connector when the removable device is connected to the host device.

10. The electronic system of claim 9, wherein the heat spreader further comprises a third surface that is in thermal communication with at least one of another portion of the circuit board and the one or more electronic components via a second TIM, wherein the heat spreader dissipates a waste-heat generated by at least one of the circuit board and the one or more electronic components, to the second surface via the second TIM and the third surface, and wherein the heat spreader transfers the waste-heat to the cooling component through the second surface, the first TIM, and the first surface.

11. The electronic system of claim 1, wherein the cooling component is at least one of a cold plate or a heat sink.

12. An electronic system comprising:
   a host device comprising a cooling component having a first surface, and a plurality of first blocks of magnetic materials coupled to the cooling component,
   wherein a removable device is detachably connectable to the host device, wherein the cooling component is movably coupled to a housing of the host device via a plurality of stand-offs, and wherein when the removable device is connected to the host device, and magnetic forces applied by at least one of the plurality of first blocks of magnetic materials or a plurality of second blocks of magnetic materials of the removable device to couple respective blocks to each other, i) the plurality of first blocks is aligned with the plurality of second blocks such that the first surface is in thermal communication with a second surface of a heat spreader of the removable device, through a thermal interface material (TIM) disposed on the second surface, and ii) the cooling component moves relative to the plurality of stand-offs and compresses the TIM in order to establish the thermal communication between the first and second surfaces.

13. The electronic system of claim 12, wherein each of the plurality of first and second blocks of magnetic materials comprise at least one of a plurality of ferromagnetic blocks or a plurality of magnetic blocks.

14. The electronic system of claim 13, wherein the removable device further comprises a layer of insulation material disposed on a surface of each of the plurality of ferromagnetic blocks interfacing with a corresponding magnetic block of the plurality of magnetic blocks to form a gap there between the ferromagnetic block and the corresponding magnetic block.

15. The electronic system of claim 13, wherein the magnetic forces applied by the plurality of magnetic blocks are controllable based on at least one of a size and/or shape of the magnetic block, a grade of the magnetic block, or an arrangement of magnetic poles of the magnetic block.

16. The electronic system of claim 12, wherein the first surface is a first tapered surface extending between a first end and a second end of the cooling component, wherein the second surface is a second tapered surface extending between a first end and a second end of the heat spreader, and wherein the first and second tapered surfaces are complementary surfaces to one another.

17. An electronic system comprising:
a host device comprising a connector coupled to a housing of the host device, a cooling component having a first surface, and a plurality of first blocks of magnetic materials coupled to the cooling component; and
a removable device comprising a circuit board, one or more electronic components coupled to the circuit board, a heat spreader having a second surface, disposed on at least one of the circuit board or the one or more electronic components, a plurality of second blocks of magnetic materials coupled to the heat spreader, and a thermal interface material (TIM) disposed on the second surface,
wherein a portion of the circuit board is detachably connectable to the connector, wherein when the circuit board is connected to the connector, and magnetic forces applied by at least one of the plurality of first blocks or the plurality of second blocks to couple respective blocks to each other, the plurality of first blocks is aligned with the plurality of second blocks such that the first surface is in thermal communication with the second surface through the TIM.

18. The electronic system of claim 17, wherein the cooling component is movably coupled to the housing via a plurality of stand-offs, and wherein when the magnetic forces applied by the at least one of the plurality of first blocks or the plurality of second blocks for coupling to each other, the cooling component moves relative to the plurality of stand-offs in order and compresses the TIM in order to establish the thermal communication between the first and second surfaces.

* * * * *